(12) United States Patent
Wang et al.

(10) Patent No.: US 11,929,115 B2
(45) Date of Patent: Mar. 12, 2024

(54) MEMORY DEVICE WITH SRAM CELLS ASSISTED BY NON-VOLATILE MEMORY CELLS AND OPERATION METHOD THEREOF

(71) Applicant: Taiwan Semiconductor Manufacturing Company, Ltd., Hsinchu (TW)

(72) Inventors: Jer-Fu Wang, Taipei (TW); Hung-Li Chiang, Taipei (TW); Yi-Tse Hung, Hsinchu (TW); Tzu-Chiang Chen, Hsinchu (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 113 days.

(21) Appl. No.: 17/715,959

(22) Filed: Apr. 8, 2022

(65) Prior Publication Data
US 2023/0326518 A1   Oct. 12, 2023

(51) Int. Cl.
*G11C 8/00* (2006.01)
*G11C 11/412* (2006.01)
*G11C 11/419* (2006.01)
*H10B 10/00* (2023.01)

(52) U.S. Cl.
CPC .......... *G11C 11/412* (2013.01); *G11C 11/419* (2013.01); *H10B 10/12* (2023.02)

(58) Field of Classification Search
CPC ...... G11C 11/412; G11C 11/419; H10B 10/12
USPC ...................................... 365/230.03
See application file for complete search history.

(56) References Cited

U.S. PATENT DOCUMENTS

| | | | | |
|---|---|---|---|---|
| 6,924,999 B2* | 8/2005 | Masui | ..................... | G11C 11/22 365/189.16 |
| 6,930,344 B2* | 8/2005 | Yokozeki | ............... | H10B 53/30 257/904 |
| 6,944,042 B2* | 9/2005 | Komatsuzaki | ...... | G11C 11/5657 365/205 |
| 9,093,168 B2* | 7/2015 | Kawashima | .......... | G11C 11/412 |

* cited by examiner

*Primary Examiner* — Tha-O H Bui
(74) *Attorney, Agent, or Firm* — JCIPRNET

(57) ABSTRACT

A memory device and an operation method thereof are provided. The memory device includes memory cells, each having a static random access memory (SRAM) cell and a non-volatile memory cell. The SRAM cell is configured to store complementary data at first and second storage nodes. The non-volatile memory cell is configured to replicate and retain the complementary data before the SRAM cell loses power supply, and to rewrite the replicated data to the first and second storage nodes of the SRAM cell after the power supply of the SRAM cell is restored.

20 Claims, 10 Drawing Sheets

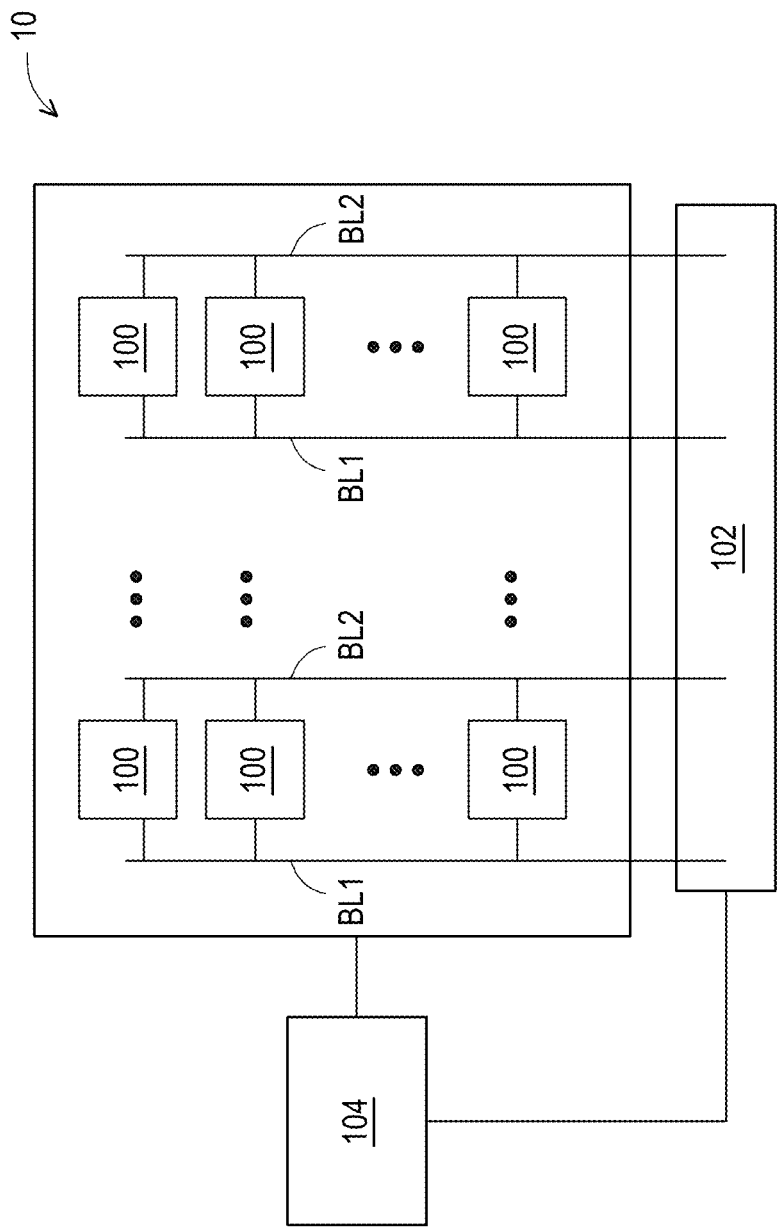

MEMORY DEVICE WITH SRAM CELLS ASSISTED BY NON-VOLATILE MEMORY CELLS AND OPERATION METHOD THEREOF

BACKGROUND

Static random access memory (SRAM) is a fundamental component in a modern integrated circuit to store copies of the most frequently used data from the main memory. High operation speed of SRAM assures desired memory throughput required by high operating frequency of the integrated circuit. However, SRAM memory is volatile, which cannot retain stored information while not being powered. Consequently, high standby power is required for data retention, and poses challenges to low power design of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a block diagram illustrating a memory device, according to some embodiments of the present disclosure.

DETAILED DESCRIPTION

Figure 1B:
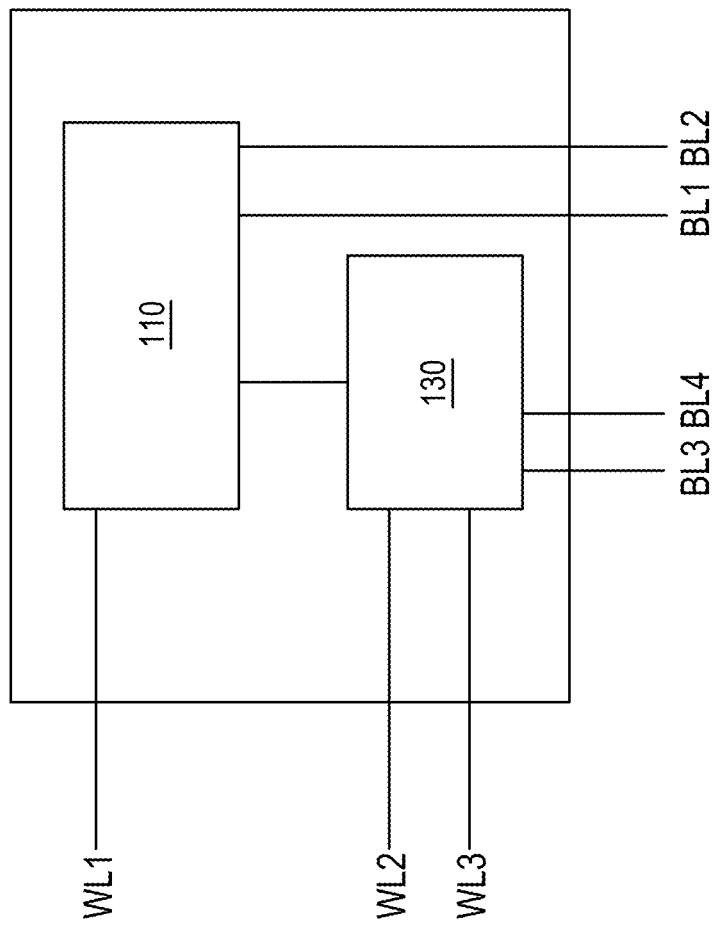
FIG. 1B is a block diagram illustrating one of the memory cells in the memory device, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

FIG. 1A is a block diagram illustrating a memory device 10 according to some embodiments of the present disclosure.

Referring to FIG. 1A, the memory device 10 includes an array of memory cells 100. Each memory cell 100 is connected to a pair of complementary bit lines BL1, BL2, and the memory cells 100 in each column may share the same pair of bit lines BL1, BL2. In addition, an input/output (I/O) block 102 may be connected to the bit lines BL1, BL2, and is configured to read and write data to and from the bit lines BL1, BL2.

A controller circuit 104 is connected to the memory cells 100 and the I/O block 102, and is configured to control operations of the memory device 10. The controller circuit 104 receives signals such as clock signals, command signals, address signals etc., for accessing the memory cells 100. For instance, address signals may be received and decoded into row and column addresses for accessing the selected memory cells 100 during read and write operations. In addition, the controller circuit 104 may further be operative to control and manage power for various components of the memory device 10. For instance, some examples include multiple power management modes. In a shut down mode, the memory cells 100 as well as circuits peripheral to the memory cells 100 (such as the I/O block 102) may be turned off to conserve power. As will be further described, each memory cell 100 includes a SRAM cell and a non-volatile memory cell. Since SRAM is volatile, data stored in the SRAM cell may be lost in the shut down mode. The non-volatile memory cell is functioned for keeping the data retained in the memory cell 100, even under the shut down mode.

FIG. 1B is a block diagram illustrating one of the memory cells 100 shown in FIG. 1A.

Referring to FIG. 1A and FIG. 1B, each memory cell 100 includes a SRAM cell 110 selectively connected to a pair of bit lines BL1, BL2 in response to a control signal received on a word line WL1. In addition, each memory cell 100 further includes a non-volatile memory cell 130 configured to copy and retain the data stored in the SRAM cell 110 before power supply is decoupled from the SRAM cell 110 (i.e., under the shut down mode), and to rewrite the SRAM cell 110 with the same data after the power supply is coupled to the SRAM cell 110 again. The non-volatile memory cell 130 is selectively connected to storage nodes of the SRAM cell 110, in response to a control signal received on word lines WL2, WL3. In addition, the non-volatile memory cell 130 is selectively connected to a pair of bit lines BL3, BL4. According to some embodiments, the non-volatile memory cell 130 is a ferroelectric random access memory (FeRAM) cell, and will be further described in details.

Figure 1C:
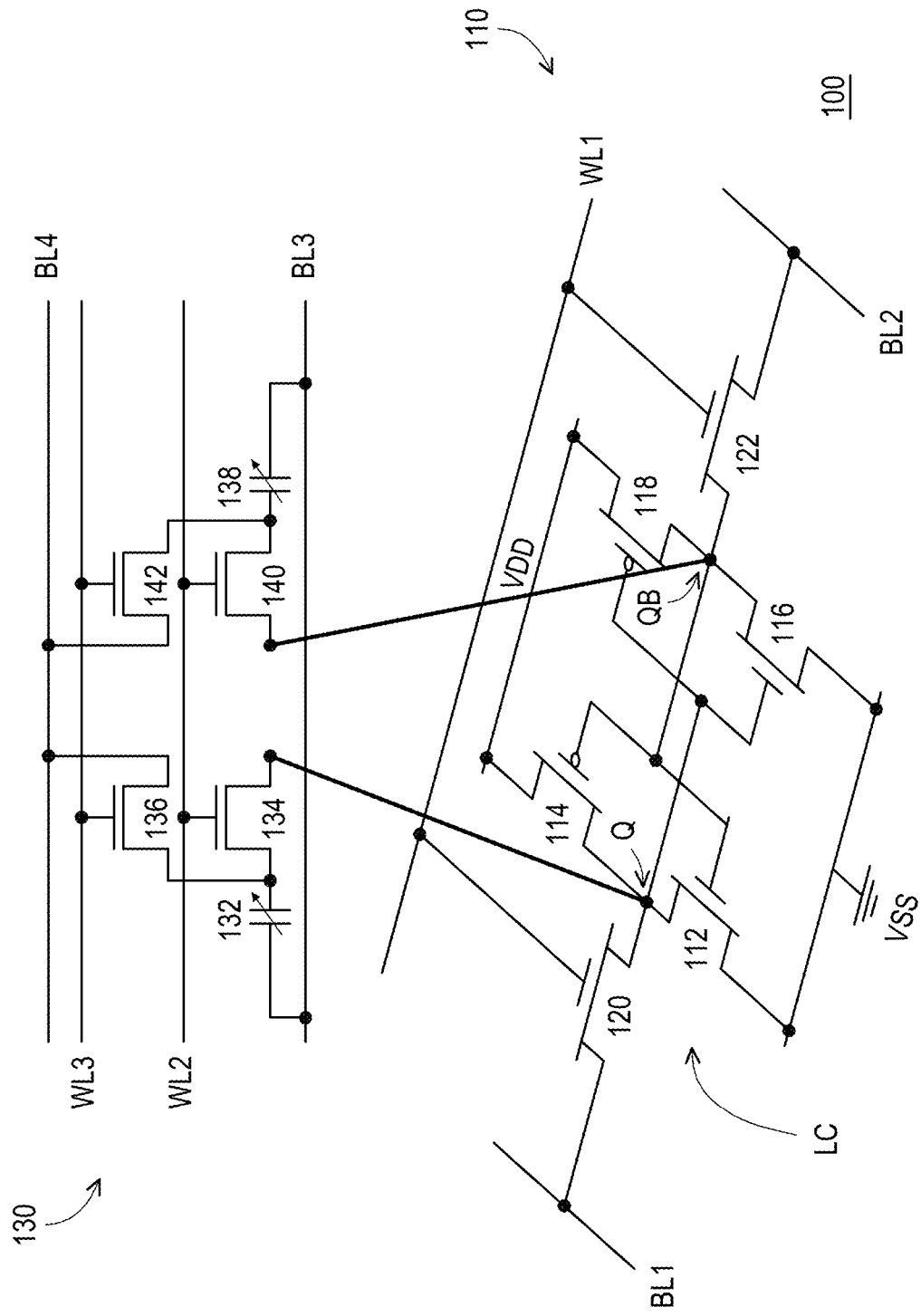
FIG. 1C is a circuit diagram illustrating one of the memory cells, according to some embodiments of the present disclosure.

FIG. 1C is a circuit diagram illustrating one of the memory cells 100, according to some embodiments of the present disclosure.

Referring to FIG. 1C, according to some embodiments, the SRAM cell 110 of the memory cell 100 includes a six-transistor (6T) SRAM architecture. In these embodiments, the SRAM cell 110 includes a latch circuit LC formed by a first inverter and a second inverter cross-coupled with the first inverter. The first inverter includes an N-type transistor 112 and a P-type transistor 114 connected with the N-type transistor 112 by a common source/drain terminal and a common gate terminal. Similarly, the second inverter includes an N-type transistor 116 and a P-type transistor 118 connected with the N-type transistor 116 by a common source/drain terminal and a common gate terminal. The common source/drain terminal of the first inverter is connected to the common gate terminal of the second inverter. On the other hand, the common source/drain terminal of the second inverter is connected to the common gate terminal of the first inverter. Further, the unshared source/drain terminal of the P-type transistor 114 in the first inverter and the unshared source/drain terminal of the P-type transistor 118 in the second inverter are selectively connected to a power supply voltage VDD. On the other hand, the unshared source/drain terminal of the N-type transistor 112 in the first inverter and the unshared source/drain terminal of the N-type transistor 116 in the second inverter are connected to a ground voltage VSS.

The common source/drain terminal of the first inverter is functioned as a first storage node Q, and the common source/drain terminal of the second inverter is functioned as a second storage node QB. When the storage node Q stores a logic high voltage (i.e., a logic state "1"), the common gate terminal of the second inverter is also charged to the logic high voltage, and N-type transistor 116 of the second inverter is turned on, while the P-type transistor 118 of the second inverter is kept in an off state. Consequently, the storage node QB is discharged to the ground voltage VSS connected to the unshared source/drain terminal of the N-type transistor 116, and stores a logic low voltage (i.e., a logic state "0"). On the other hand, when the storage node Q stores the logic low voltage, the storage node QB stores the logic high voltage. In other words, the storage nodes Q, QB are configured to store complementary data.

Moreover, an access transistor 120 is connected to the storage node Q, for controlling access of the storage node Q. The access transistor 120 may be an N-type transistor, with a gate terminal connected to the word line WL; a source/drain terminal connected to the storage node Q; and the other source/drain terminal connected to the bit line BL1. When the word line WL is asserted, the access transistor 120 is turned on, and the storage node Q can be written or sensed through the bit line BL1. Otherwise, the storage node Q is decoupled from the bit line BL1.

Similarly, an access transistor 122 is connected to the storage node QB, for controlling access of the storage node QB. The access transistor 122 may be an N-type transistor, with a gate terminal connected to the word line WL; a source/drain terminal connected to the storage node QB; and the other source/drain terminal connected to the bit line BL2. When the word line WL is asserted, the access transistor 120 is turned on as well, and the storage node QB can be written or sensed through the bit line BL2. Otherwise, the storage node QB is decoupled from the bit line BL2.

In an active mode of the SRAM cell 110, the latch circuit LC is powered by the power supply voltage VDD, and complementary data can be kept at the storage nodes Q, QB. However, in a shut down mode of the SRAM cell 110, the power supply voltage VDD is decoupled from the latch circuit LC, and the data stored at the storage nodes Q, QB eventually disappear. In order to prevent the stored data from vanishing, the stored data is copied to and retained at the non-volatile memory cell 130 connected to the storage nodes Q, QB before removal of the power supply voltage VDD. Further, the replicated data can be rewritten to the storage nodes Q, QB after the power supply voltage VDD is coupled to the latch circuit LC of the SRAM cell 110 once again.

According to some embodiments, the non-volatile memory cell 130 includes a first ferroelectric tunneling junction (FTJ) 132 selectively connected to the storage node Q of the SRAM cell 110. As will be further described in details, the FTJ 132 includes a pair of electrodes and a ferroelectric layer sandwiched between the pair of electrodes. The ferroelectric layer in the FTJ 132 can be polarized by applying a voltage across the ferroelectric layer. By changing polarity of the voltage, the FTJ 132 can have opposite polarization directions, and can be switched between a low resistance state and a high resistance state. As a result, the FTJ 132 can store complementary data. Further, since the polarization of the ferroelectric layer remains even after removal of the voltage across the ferroelectric layer, the data stored in the FTJ 132 can be retained permanently, until the FTJ 132 is rewritten with a complementary data. In other words, the FTJ 132 is functioned as a non-volatile storage medium. As will be further described, the data stored at the storage node Q of the SRAM cell 110 can be copied to the FTJ 132 before the power supply voltage VDD is decoupled from the latch circuit LC of the SRAM cell 100, and the replicated data can be rewritten to the storage node Q after the power supply voltage VDD is coupled to the latch circuit LC once again.

Connection between the FTJ 132 and the storage node Q is controlled by a selection transistor 134. A source/drain terminal of the selection transistor 134 is connected to the storage node Q, while the other source/drain terminal of the selection transistor 134 is connected to a terminal of the FTJ 132. In addition, a gate terminal of the selection transistor 134 for switching conduction between the source/drain terminals of the selection transistor 134 is connected to the word line WL2. In some embodiments, the selection transistor 134 is an N-type transistor.

According to some embodiments, the FTJ 132 is pre-programmed before receiving the data stored at the storage node Q. The pre-programming is carried out by setting sufficient voltage difference at the bit lines BL3, BL4 connected to opposite terminals of the FTJ 132. The bit line BL3 may be directly connected to the terminal of the FTJ 132 not being shared with the selection transistor 134, while the bit line BL4 may be selectively connected to the terminal of the FTJ 132 shared with the selection transistor 134. A selection transistor 136 is disposed between the bit line BL4 and the FTJ 132 for controlling connection therebetween. A source/drain terminal of the selection transistor 136 is connected to the bit line BL4, whereas the other source/drain terminal of the selection transistor 136 is connected to the terminal of the FTJ 132 coupled to the storage node Q through the selection transistor 134. A gate terminal of the selection transistor 136 for switching conduction between the source/drain terminals of the selection transistor 136 is connected to the word line WL3. Consequently, one of the terminals of the FTJ 132 may be directly connected to the bit line BL3, while the other terminal of the FTJ 132 is selectively connected to the storage node Q through the selection transistor 134, and selectively connected to the bit line BL4 through the selection transistor 136. The connection between the FTJ 132 and the storage node Q is controlled by the selection transistor 134, while the connection between the FTJ 132 and the bit line BL4 is controlled by the selection transistor 136. According to some embodiments, the selection transistors 134, 136 are both N-type transistors.

On the other hand, the storage node QB of the SRAM cell 110 is selectively connected to a second FTJ 138 of the non-volatile memory cell 130. The data stored at the storage node QB can be copied to the FTJ 138 before the power supply voltage VDD is decoupled from the latch circuit LC of the SRAM cell 110, and the replicated data can be rewritten to the storage node QB after the power supply voltage VDD is coupled to the latch circuit LC once again. As similar to the FTJ 132, the FTJ 138 includes a pair of electrodes and a ferroelectric layer sandwiched between the electrodes.

Connection between the FJT 138 and the storage node QB is controlled by a selection transistor 140. A source/drain terminal of the selection transistor 140 is connected to the storage node QB, while the other source/drain terminal of the selection transistor 140 is connected to a terminal of the FTJ 138. In addition, a gate terminal of the selection transistor 140 for switching conduction between the source/drain terminals of the selection transistor 140 is connected to the word line WL2. In some embodiments, the selection transistor 140 is an N-type transistor.

In order to pre-programmed the FTJ 138, a sufficient voltage difference is set at the bit lines BL3, BL4 connected to the terminal of the FTJ 138. The bit line BL3 may be directly connected to the terminal of the FTJ 138 not being shared with the selection transistor 140, while the bit line BL4 may be selectively connected to the terminal of the FTJ 138 shared with the selection transistor 140. A selection transistor 142 is disposed between the bit line BL4 and the FTJ 138 for controlling connection therebetween. A source/drain terminal of the selection transistor 142 is connected to the bit line BL4, whereas the other source/drain terminal of the selection transistor 142 is connected to the terminal of the FTJ 138 coupled to the storage node QB through the selection transistor 140. A gate terminal of the selection transistor 142 for switching conduction between the source/drain terminals of the selection transistor 142 is connected to the word line WL3. Consequently, one of the terminals of the FTJ 138 may be directly connected to the bit line BL3, while the other terminal of the FTJ 138 is selectively connected to the storage node QB through the selection transistor 140, and selectively connected to the bit line BL4 through the selection transistor 142. The connection between the FTJ 138 and the storage node QB is controlled by the selection transistor 140, whereas the connection between the FTJ 138 and the bit line BL4 is controlled by the selection transistor 142. According to some embodiments, the selection transistors 140, 142 are both N-type transistors.

Figure 2:
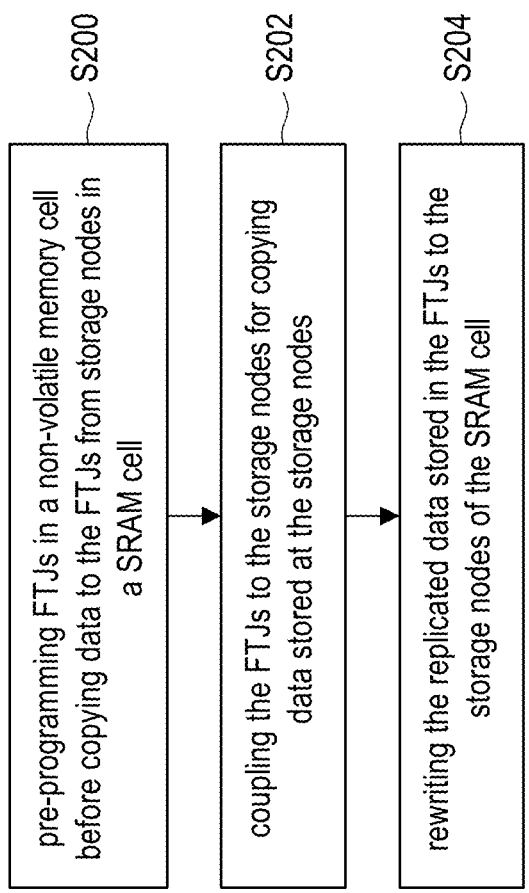
FIG. 2 is a flow diagram illustrating a method for transferring data between a SRAM cell and a non-volatile memory cell in the same memory cell, according to some embodiments of the present disclosure.
Figure 3:
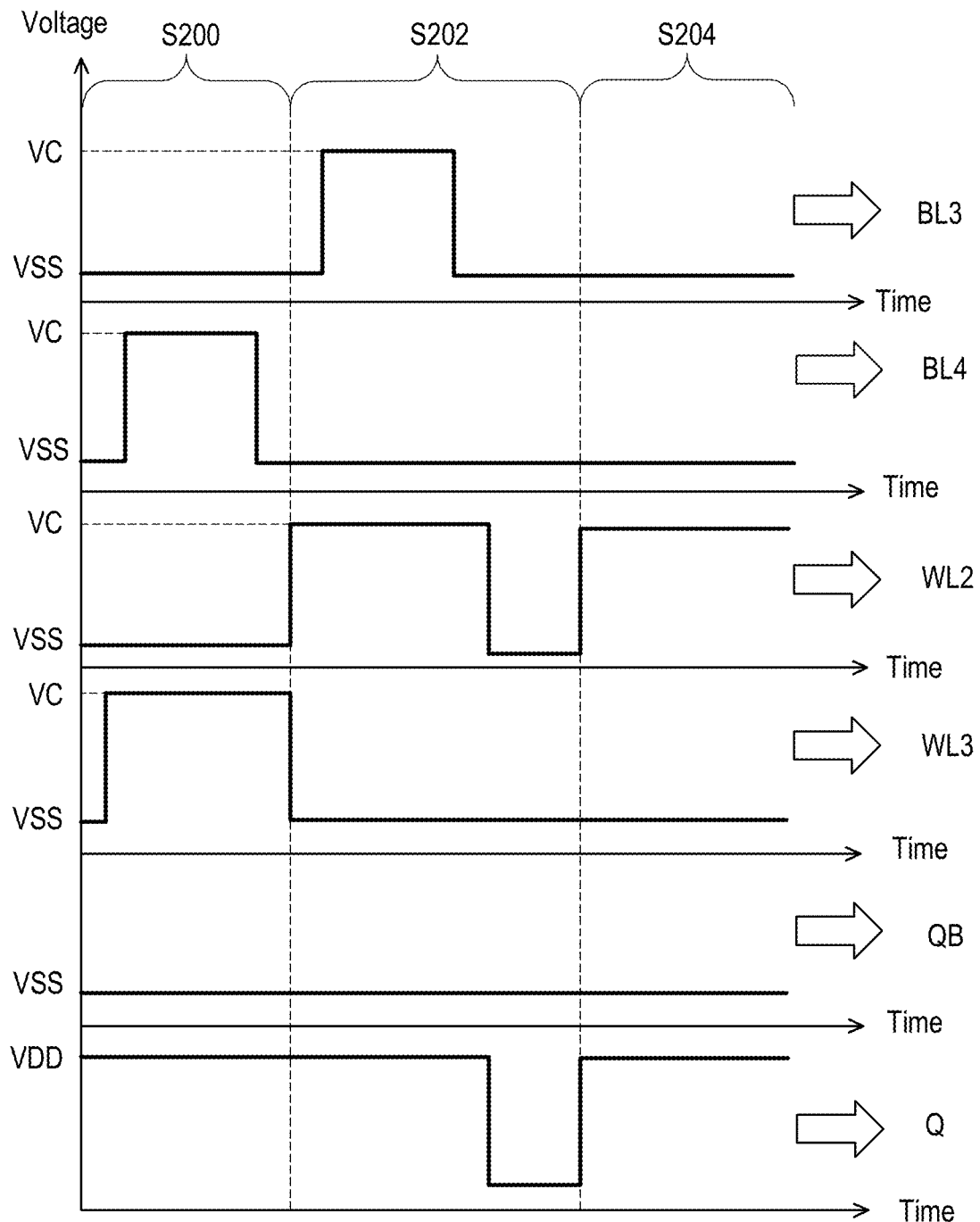
FIG. 3 illustrates wave forms during the data transfer between the SRAM cell and the non-volatile memory cell as shown in FIG. 2, in accordance with some embodiments of the present disclosure.

FIG. 2 is a flow diagram illustrating a method for transferring data between the SRAM cell 110 and the non-volatile memory cell 130, according to some embodiments of the present disclosure. FIG. 3 illustrates wave forms during the data transfer between the SRAM cell 110 and the non-volatile memory cell 130 as shown in FIG. 2, in accordance with some embodiments of the present disclosure. In addition, FIG. 4A and FIG. 4B illustrate status of the SRAM cell 110 and the non-volatile memory cell 130 during the data transfer, in accordance with the wave forms shown in FIG. 3.

Prior to the data transfer, complementary data is written to the storage nodes Q, QB of the SRAM cell 110 as shown in FIG. 1C. For instance, a logic data "1" represented as a logic high voltage is written to the storage node Q, while a logic data "0" represented as a logic low voltage is written to the storage node QB. During the write operation, the word line WL1 is asserted for turning on the access transistors 120, 122, thus the complementary data received on the bit lines BL1, BL2 can be transferred to the storage nodes Q, QB. Meanwhile, the SRAM cell 110 is in the active mode where the latch circuit LC is coupled to the power supply voltage VDD and the ground voltage VSS, for keeping the complementary data at the storage nodes Q, QB even after the storage nodes Q, QB are decoupled from the bit lines BL1, BL2. In addition, the non-volatile memory cell 130 is currently decoupled from the SRAM cell 110 by keeping the selection transistors 134, 140 in an off state. Before the SRAM cell 110 is switched to a shut down mode where the power supply voltage VDD is decoupled from the latch circuit LC, the data stored at the storage nodes Q, QB is copied to and retained at the non-volatile memory cell 130. Further, the replicated data stored in the non-volatile memory cell 130 is rewritten to the storage nodes Q, QB while switching back to the active mode. A sequence of operations are required for realizing the data transfer between the SRAM cell 110 and the non-volatile memory cell 130.

Figure 4A:
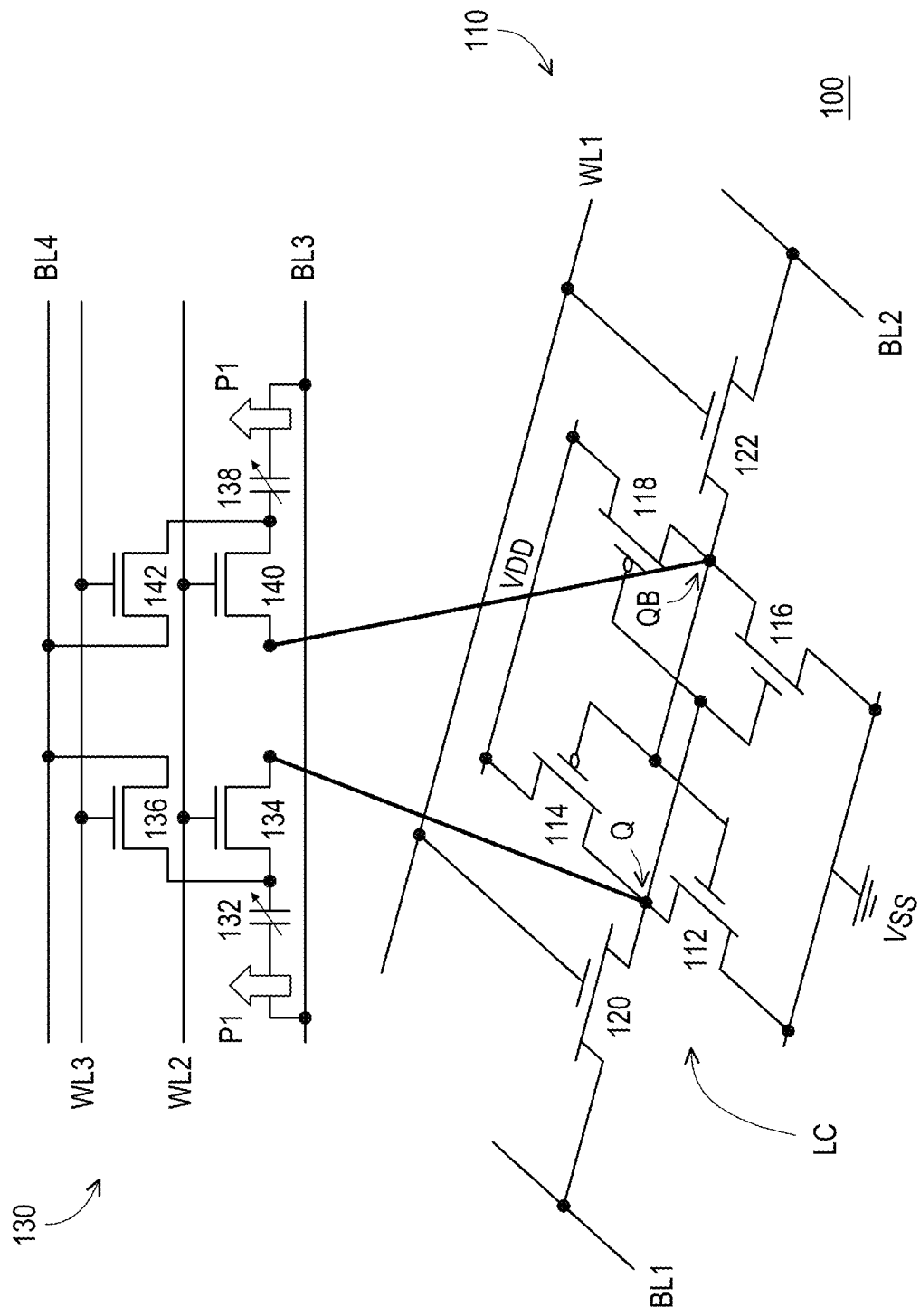
FIG. 4A and FIG. 4B illustrate status of the SRAM cell and the non-volatile memory cell during the data transfer, in accordance with the wave forms shown in FIG. 3.

Referring to FIG. 2, FIG. 3 and FIG. 4A, at an operation S200, the FTJs 132, 138 in the non-volatile memory cell 130 are pre-programmed before receiving the data stored at the storage nodes Q, QB of the SRAM cell 110. During the pre-programming operation, the word line WL3 is asserted for turning on the selection transistors 136, 142. In those embodiments where the selection transistors 136, 142 are N-type transistors, the word line WL3 is asserted by receiving a positive voltage VC. In addition to asserting the word line WL3, a voltage difference is set between the bit lines BL3, BL4. Since the selection transistors 136, 142 are turned on by the asserted word line WL3, the voltage difference between the bit lines BL3, BL4 can be applied across each of the FTJs 132, 138, so as to program the FTJs 132, 138. According to some embodiments, the bit line BL4 also receives the positive voltage VC, while the bit line BL3 may be coupled to the ground voltage VSS. In these embodiments, the voltage across each of the FTJs 132, 138 is substantially equal to the voltage VC. The voltage VC is high enough for programming the FTJs 132, 138. Correspondingly, the FTJs 132, 138 are polarized. As shown in FIG. 4A, the FTJs, 132, 138 are respectively programmed to have a polarization direction P1. It should be noted that, the polarization direction P1 is not limited to be pointing upwardly. Those skilled in the art may alter the polarization direction P1 of the FTJs 132, 138 by changing geometry of the FTJs 132, 138, as long as the FTJs 132, 138 can be pre-programmed to have identical polarization direction. Meanwhile, the selection transistors 134, 140 are kept decoupled from the storage nodes Q, QB. In those embodiments where the selection transistors 134, 140 are N-type transistors, the word line WL2 connected to the gate terminals of the selection transistors 134, 140 may be coupled to the ground voltage VSS. Further, the SRAM cell 110 is still under the active mode, such that the storage nodes Q, QB still keep the complementary data. For instance, the storage node Q holds at the power supply voltage VDD, whereas the storage node QB holds at the ground voltage VSS.

Figure 4B:
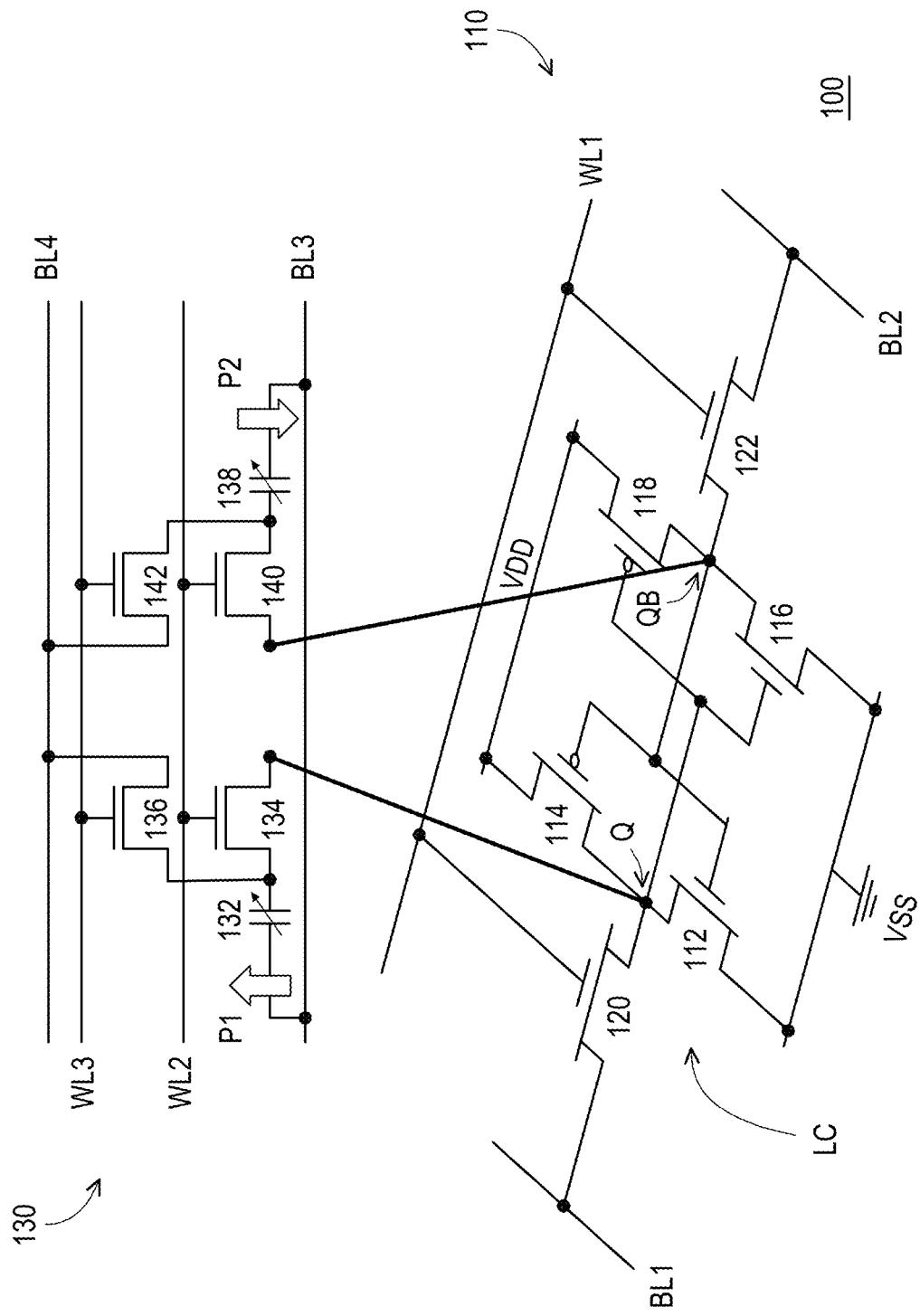

Referring to FIG. 2, FIG. 3 and FIG. 4B, at an operation S202, the FTJs 132, 138 are coupled to the storage nodes Q, QB for copying the data stored at the storage nodes Q, QB. In order to couple the FJTs 132, 138 to the storage nodes Q, QB, the word line WL2 for controlling switching of the selection transistors 134, 140 is asserted. In those embodiments where the selection transistors 134, 140 are N-type transistors, the word line WL2 is asserted by receiving a positive voltage (e.g., the positive voltage VC). In addition, the bit line BL3 receives a positive voltage (e.g., the positive voltage VC). In those embodiments where the storage node Q holds at the power supply voltage VDD and the storage node QB holds at the ground voltage VSS, a small voltage difference between the power supply voltage VDD at the storage node Q and the voltage VC at the bit line BL3 is set across the FTJ 132, and is insufficient for altering polarization of the FTJ 132. As a result, the FTJ 132 still has the polarization direction P1. On the other hand, a great voltage difference between the ground voltage VSS at the storage node QB and the voltage VC at the bit line BL3 is set across the FJT 138. As such voltage difference has a polarity opposite to the polarization direction P1 and an amplitude great enough to program the FTJ 138, the FTJ 138 is overwritten to have a polarization direction P2 opposite to the polarization direction P1. Therefore, the FTJs 132, 138 currently have opposite polarization directions, which indicate complementary data copied from the storage nodes Q, QB. One of the FTJs 132, 138 is in a high resistance state and can be regarded as a capacitor, while the other one of the FTJs 132, 138 is in a low resistance state and can be regarded as a short circuit. For instance, the FTJ 132 having the polarization direction P1 is in the high resistance state and can be regarded as a capacitor, whereas the FTJ 138 having the polarization direction P2 is in the low resistance state and can be regarded as a short circuit.

Further, the FTJs 132, 138 are currently decoupled from the bit line BL4, thus polarization of the FTJ2 132, 138 can be dependent on the data stored at the storage nodes Q, QB. In those embodiments where the selection transistors 136, 142 between the FTJs 132, 138 and the bit line BL4 are N-type transistors, the word line WL3 controlling switching of the selection transistors 136, 142 is currently discharged to the ground voltage VSS for keeping the selection transistors 136, 142 in an off state. According to some embodiments, the bit line BL4 is also discharged to the ground voltage VSS during the current operation.

After the data stored at the storage nodes Q, QB is copied to the FTJs 132, 138, the SRAM cell 110 may be switched to a shut down mode, and the power supply voltage VDD may be decoupled from the latch circuit LC. In those embodiments where the storage node Q previously held at the power supply voltage VDD and the storage node QB previously held at the ground voltage VSS, the storage node Q may no longer hold at the power supply voltage VDD, but discharge to a lower voltage, as shown in FIG. 3. In other words, after being copied to the non-volatile memory cell 130, the complementary data may be no longer kept in the SRAM cell 110.

Referring to FIG. 2, FIG. 3 and FIG. 4B, at an operation S204, the replicated data stored in the FTJs 132, 138 is rewritten to the storage nodes Q, QB. In order to transfer the replicated data back to the storage nodes Q, QB, the selection transistors 134, 140 for controlling connection between the FTJs 132, 138 and the storage nodes Q, QB are turned on by asserting the word line WL2. In those embodiments where the selection transistors 134, 140 are N-type transistors, the word line WL2 may be charged to the positive voltage VC for turning on the selection transistors 134, 140. In addition, the bit line BL3 may be discharged to the ground voltage VSS. The one of the FTJs 132, 138 in the low resistance state may be regarded as a short circuit, and the corresponding one of the storage nodes Q, QB is coupled to the ground voltage VSS held at the bit line BL3. On the other hand, the other one of the FTJs 132, 138 in the high resistance state may be functioned as a capacitor, and charges the corresponding one of the storage nodes Q, QB. For instance, the FTJ 138 may be in the low resistance state and act as a short circuit, such that the storage node QB can be coupled to the ground voltage VSS at the bit line BL3. In addition, the FTJ 132 may be in the high resistance state, and the storage node Q connected to the FTJ 132 may be charged by the FTJ 132 functioned as a capacitor. Consequently, complementary data is rewritten to the storage nodes Q, QB from the FTJs 132, 138. According to some embodiments, the SRAM cell 110 is switched to the active mode while being rewritten by the non-volatile memory cell 130. In these embodiments, one of the storage nodes Q, QB (e.g., the storage node Q) is pulled up to the power supply voltage VDD, while the other one of the storage nodes QB (e.g., the storage node QB) is coupled to the ground voltage VSS.

During the current operation, the FTJs 132, 138 are decoupled from the bit line BL4. In those embodiments where the selection transistors 136, 142 between the FTJs 132, 138 and the bit line BL4 are N-type transistors, the word line WL3 controlling switching of the selection transistors 136, 142 is maintained at the ground voltage VSS for keeping the selection transistors 136, 142 in an off state. According to some embodiments, the bit line BL4 is also maintained at the ground voltage VSS during the current operation.

Up to here, a cycle of data transfer between the SRAM cell 110 and the non-volatile memory cell 130 has been completed. After the complementary data is rewritten back to the SRAM cell 110, the non-volatile memory cell 130 is decoupled from the SRAM cell 110, and the SRAM cell 110 can be subjected to a further operation. For instance, the data rewritten to the SRAM cell 110 can be read out. In order to read the SRAM cell 110, the bit lines BL1, BL2 may both be pre-charged, and the word line WL1 is asserted for turning on the access transistors 120, 122. One of the bit lines BL1, BL2 may be pulled down by one of the storage nodes Q, QB coupled to the ground voltage VSS. A sense amplifier circuit (not shown) may be used for sensing voltage variation on the bit lines BL1, BL2, and an output of the sense amplifier circuit indicates how the complementary data is placed on the storage nodes Q, QB.

The data transfer cycle can be repeated before the SRAM cell 110 is switched to the shut down mode once again. By combining the non-volatile memory cell 130 and the SRAM cell 110 in the memory cell 100, data stored in the SRAM cell 110 can be copied to and retained at the non-volatile memory cell 130 when the SRAM cell 110 loses power supply. In addition, when the power supply of the SRAM cell 110 is restored, the data retained in the non-volatile memory cell 130 can be rewritten to the SRAM cell 110. Therefore, the SRAM cell 110 does not require constant power supply for retaining the stored data. In other words, standby power of the SRAM cell 110 can be effectively reduced. Further, during read and write operations of the SRAM cell 110, the SRAM cell 110 is remained disconnected from the non-volatile memory cell 130, and this allows high speed operation of the SRAM cell 110.

Figure 5:
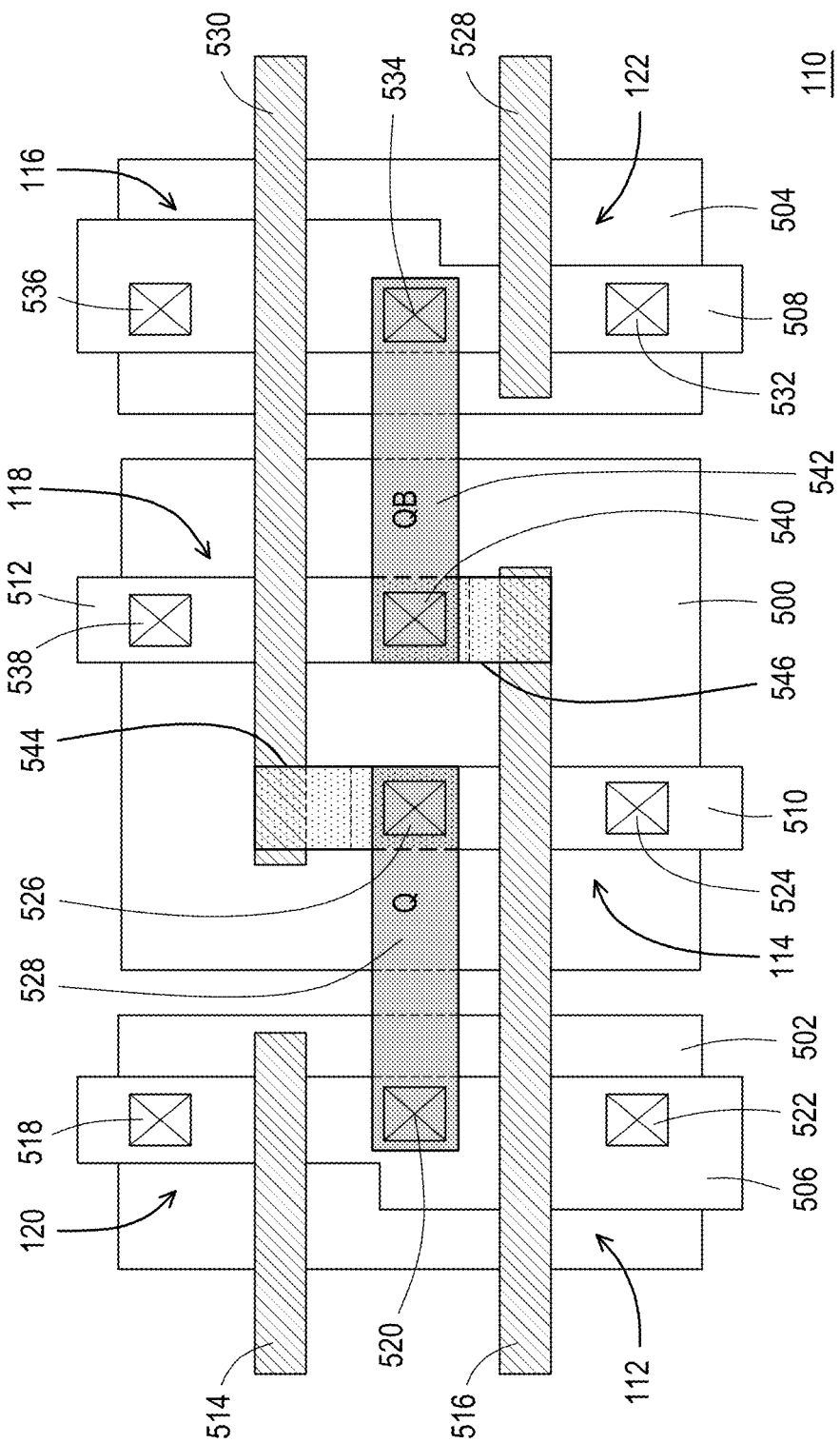
FIG. 5 is a schematic plan view illustrating a layout of the SRAM cell, according to some embodiments of the present disclosure.

FIG. 5 is a schematic plan view illustrating a layout of the SRAM cell 110, according to some embodiments of the present disclosure.

Referring to FIG. 5, according to some embodiments, the SRAM cell 110 may be built on an N-type well 500 and two P-type wells 502, 504 at opposite sides of the N-type well 500. The wells 500, 502, 504 are doped regions in a semiconductor substrate. The N-type transistors 112, 116 and the access transistors 120, 122 are formed on the P-type wells 502, 504, while the P-type transistors 114, 118 are formed on the N-type well 500.

An active structure 506 is formed across the P-type well 502, and an active structure 508 is formed across the P-type well 504. The active structures 506, 508 may respectively be a P-type doped region formed in a shallow region of the semiconductor substrate. Alternatively, the active structure 506, 508 may respectively be fin structure(s) or stack(s) of semiconductor nanosheets lying on the semiconductor substrate. These fin structure(s) or stack(s) of semiconductor nanosheets may be P-type or intrinsic.

Similarly, active structures 510, 512 are formed across the N-type well 500. The active structures 510, 512 are laterally spaced apart from each other, and each structurally similar to the active structure 506/508. As a difference from the active structures 506, 508, the active structures 510, 512 may be N-type or intrinsic. In addition, the active structures 510, 512 may be offset with respect to each other along an extending direction of the active structures 510, 512.

Separate gate lines 514, 516 intersect and cover the active structure 506. The access transistor 120 is defined in the vicinity where the gate line 514 intersects with the active structure 506, and the N-type transistor 112 is defined in the vicinity where the gate line 516 intersects with the active structure 506. The gate line 514 is functioned as a gate terminal of the access transistor 120, and is connected to the word line WL as described with reference to FIG. 1C. In addition, the gate line 516 is functioned as a gate terminal of the N-type transistor 112. Source/drain structures (not shown) of the access transistor 120 and the N-type transistor 112 are formed on the active structure 506 and at opposite sides of each of the gate lines 514, 516, and are routed via overlying source/drain contacts 518, 520, 522. The source/drain structure and the overlying source/drain contact 518 is functioned as a source/drain terminal of the access transistor 120, and may be routed to the bit line BL1 as described with reference to FIG. 1C. The source/drain structure and the overlying source/drain contact 520 are functioned as a common source/drain terminal shared by the access transistor 120 and the N-type transistor 112, which is further jointed with a source/drain terminal of the P-type transistor 114 and a shared gate terminal of the N-type transistor 116 and the P-type transistor 118, as will be further described. The source/drain structure and the overlying source/drain contact 522 is functioned as the other source/drain terminal of the N-type transistor 112, and is coupled to the ground voltage VSS as described with reference to FIG. 1C.

The gate line 516 further extends to intersect with and cover the active structure 510 within the N-type well 500. The P-type transistor 114 is defined in the vicinity where the gate line 516 intersects with the active structure 510. The gate line 516 as the gate terminal of the N-type transistor 112 is also functioned as a gate terminal of the P-type transistor 114. In other words, the gate line 516 is shared by the N-type transistor 112 and the P-type transistor 114. Source/drain structures (not shown) are formed on the active structure 510 at opposite sides of the gate line 516, and are routed via overlying source/drain contacts 524, 526. The source/drain contact 524 is selectively coupled to the power supply voltage VDD, as described with reference to FIG. 1C. The source/drain contact 526 is jointed with the source/drain contact 520 shared by the access transistor 120 and the N-type transistor 112 by an interconnecting line 528. The common source/drain structure shared by the N-type transistor 112 and the access transistor 120 as well as one of the source/drain structures of the P-type transistor 114 are connected together by the source/drain contacts 520, 526 and the interconnecting line 528, and these elements collectively form the storage node Q as described with reference to FIG. 1C.

Similarly, separate gate lines 528, 530 intersect and cover the active structure 508. The access transistor 122 is defined in the vicinity where the gate line 528 intersects with the active structure 508, and the N-type transistor 116 is defined in the vicinity where the gate line 530 intersects with the active structure 508. The gate line 528 is functioned as a gate terminal of the access transistor 122, and is connected to the word line WL as described with reference to FIG. 1C. In addition, the gate line 530 is functioned as a gate terminal of the N-type transistor 116. Source/drain structures (not shown) of the access transistor 122 and the N-type transistor 116 are formed on the active structure 508 and at opposite sides of each of the gate lines 528, 530, and are routed via overlying source/drain contacts 532, 534, 536. The source/drain structure and the overlying source/drain contact 532 is functioned as a source/drain terminal of the access transistor 122, and may be routed to the bit line BL2 as described with reference to FIG. 1C. The source/drain structure and the overlying source/drain contact 534 is functioned as a common source/drain terminal shared by the access transistor 122 and the N-type transistor 116, which is further jointed with a source/drain terminal of the P-type transistor 118 and the gate line 516 shared by the N-type transistor 112 and the P-type transistor 114, as will be further described. The source/drain structure and the overlying source/drain contact 536 is functioned as the other source/drain terminal of the N-type transistor 116, and is coupled to the ground voltage VSS as described with reference to FIG. 1C.

The gate line 530 further extends to intersect with and cover the active structure 512 within the N-type well 500. The P-type transistor 118 is defined in the vicinity where the gate line 530 intersects with the active structure 512. The gate line 530 functioned as the gate terminal of the N-type transistor 116 is also functioned as a gate terminal of the P-type transistor 118. In other words, the gate line 530 is shared by the N-type transistor 116 and the P-type transistor 118. Source/drain structures (not shown) are formed on the active structure 512 at opposite sides of the gate line 530, and are routed via overlying source/drain contacts 538, 540. The source/drain contact 538 is selectively coupled to the power supply voltage VDD, as described with reference to FIG. 1C. The source/drain contact 540 is jointed with the source/drain contact 534 shared by the access transistor 122 and the N-type transistor 116 through an interconnecting line 542. The shared source/drain structure of the N-type transistor 116 and the access transistor 122 as well as one of the source/drain structures of the P-type transistor 118 are connected together by the source/drain contacts 534, 540 and the interconnecting line 546, and these elements collectively form the storage node QB as described with reference to FIG. 1C.

Further, the source/drain structure of the P-type transistor 114 jointed with one of the source/drain structures of the N-type transistor 112 to form the storage node Q may be further connected to the gate line 530 via a butted contact 544. On the other hand, the source/drain structure of the P-type transistor 118 jointed with one of the source/drain structures of the N-type transistor 116 to form the storage node QB may be further connected to the gate line 516 via a butted contact 546.

Although not shown, the word line WL1 and the bit lines BL1, BL2 may run above the layout patterns shown in FIG. 5. According to some embodiments, power rails for providing the power supply voltage VDD and the ground voltage VSS are also disposed over the layout patterns shown in FIG. 5.

Figure 6:
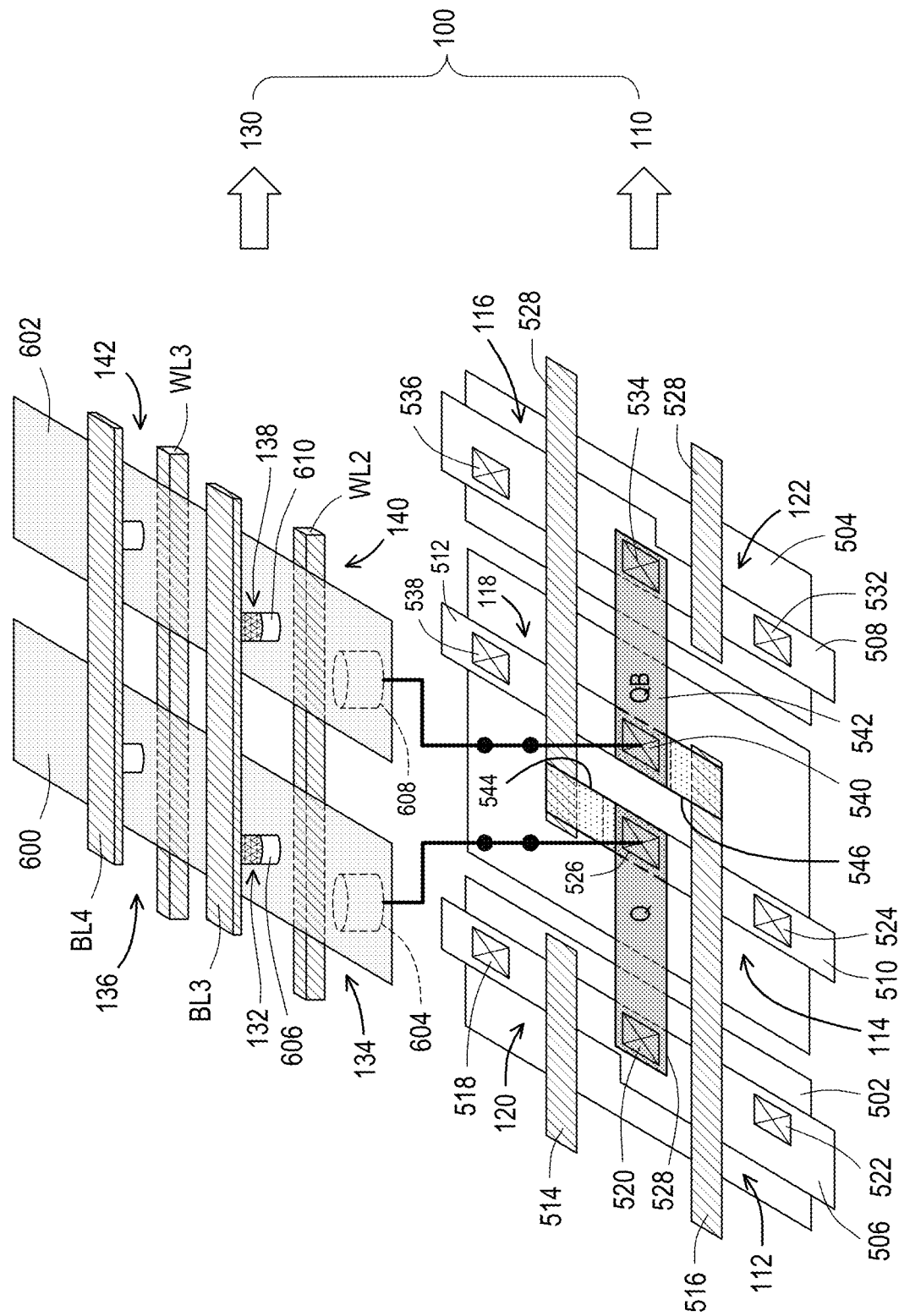
FIG. 6 is a schematic three-dimensional view illustrating the non-volatile memory cell and the SRAM cell, according to some embodiments of the present disclosure.

FIG. 6 is a schematic three-dimensional view illustrating the non-volatile memory cell 130 connected to the underlying SRAM cell 110 as shown in FIG. 5, according to some embodiments of the present disclosure.

Referring to FIG. 6, the non-volatile memory cell 130 is disposed over the SRAM cell 110, and embedded in an interconnection structure stacked over the transistors in the SRAM cell 110, along with the interconnecting lines 528, 542, the word line WL1 and the bit lines BL1, BL2. In addition, the non-volatile memory cell 130 is connected to the storage nodes Q, QB of the SRAM cell 110. As described with reference to FIG. 5, the storage node Q are jointed elements including the interconnecting line 528 and the source/drain contacts 520, 526, and the storage node QB are jointed elements including the interconnecting line 542 and the source/drain contacts 534, 540. The non-volatile memory cell 130 may be connected to the interconnecting lines 528, 542 through landing vias (not shown). In certain embodiments, the landing vias for establishing contact with the SRAM cell 110 may overlap the source/drain contacts 526, 542.

In some embodiments, the non-volatile memory cell 130 includes separate semiconductor regions 600, 602 (e.g., semiconductor patterns). Conduction channels of the selection transistors 134, 136 can be established in the semiconductor region 600, while conduction channels of the selection transistors 140, 142 can be established in the semiconductor region 602. The semiconductor regions 600, 602 are formed of a semiconductor material. For instance, the semiconductor material may include indium gallium zinc oxide (IGZO), silicon, silicon germanium or the like.

The word line WL2 may extend below the semiconductor regions 600, 602, and capacitively coupled to the semiconductor regions 600, 602. The selection transistor 134 is defined in the vicinity where the word line WL2 intersects with the semiconductor region 600. The word line WL2 is functioned as a gate terminal of the selection transistor 134. Portions of the semiconductor region 600 at opposite sides of the word line WL2 may be functioned as source/drain terminals of the selection transistor 134. In addition, one of the source/drain terminals of the selection transistor 134 is connected to the storage node Q of the SRAM cell 110 through a bottom via 604. As described above, the bottom via 604 may be routed to a landing via (not shown) establishing contact with the storage node Q of the SRAM cell 110. On the other hand, the other source/drain terminal of the selection transistor 134 may be connected to the FTJ 132 over the semiconductor region 600. In some embodiments, this source/drain terminal of the selection transistor 134 is connected to the FTJ 132 through a top via 606 disposed between the FTJ 132 and the semiconductor region 600.

In addition, the selection transistor 140 is defined in the vicinity where the word line WL2 intersects with the semiconductor region 602. The word line WL2 functioned as the gate terminal of the selection transistor 132 is also functioned as a gate terminal of the selection transistor 140. In other words, the selection transistors 132, 140 can be simultaneously switched by the word line WL2. Portions of the semiconductor region 602 at opposite sides of the word line WL2 may be functioned as source/drain terminals of the selection transistor 140. In addition, one of the source/drain terminals of the selection transistor 140 is connected to the storage node QB of the SRAM cell 110 through a bottom via 608. As described above, the bottom via 608 may be routed to a landing via (not shown) establishing contact with the storage node QB of the SRAM cell 110. On the other hand, the other source/drain terminal of the selection transistor 140 may be connected to the FTJ 138 over the semiconductor region 602. In some embodiments, this source/drain terminal of the selection transistor 140 is connected to the FTJ 132 through a top via 610 disposed between the FTJ 132 and the semiconductor region 602.

The FTJs 132, 138 may be each formed in a pillar shape. Although not shown, the FTJs 132, 138 respectively include a pair of electrodes and a ferroelectric layer sandwiched between the electrodes. The ferroelectric layer is formed of a ferroelectric material. According to some embodiments, the ferroelectric material includes hafnium zirconium oxide (HZO). The hafnium zirconium oxide can be represented as $Hf_{1-x}Zr_xO2$, where x ranges from about 0.5 to about 0.8.

The bit line BL3 may extend over the semiconductor regions 600, 602, and electrically connect to the FTJs 132, 138 from above the FTJs 132, 138. Contact vias (not shown) may be optionally disposed between the bit line BL4 and the FTJs 132, 138, for establishing connection between the bit line BL4 and the FTJs 132, 138.

As similar to the word line WL2, the word line WL3 may also extend below the semiconductor regions 600, 602, and is capacitively coupled to the semiconductor regions 600, 602. The selection transistor 136 is defined in the vicinity where the word line WL3 intersects with the semiconductor region 600. The word line WL3 is functioned as a gate terminal of the selection transistor 136. Portions of the semiconductor region 600 at opposite sides of the word line WL3 may be functioned as source/drain terminals of the selection transistor 136. One of the source/drain terminals of the selection transistor 136 is shared with the selection transistor 134, and is connected to the FTJ 132. The other source/drain terminal of the selection transistor 136 is connected to the bit line BL4 running over the semiconductor regions 600, 602. In some embodiments, this source/drain terminal of the selection transistor 136 is connected to the bit line BL4 through a top via 612 disposed between the bit line BL4 and the semiconductor region 600.

In addition, the selection transistor 142 is defined in the vicinity where the word line WL3 intersects with the semiconductor region 602. The word line WL3 functioned as the gate terminal of the selection transistor 136 is also functioned as a gate terminal of the selection transistor 142. In other words, the selection transistors 136, 142 can be simultaneously switched by the word line WL3. Portions of the semiconductor region 602 at opposite sides of the word line WL3 may be functioned as source/drain terminals of the selection transistor 142. In addition, one of the source/drain terminals of the selection transistor 142 is shared with the selection transistor 140, and is connected to the FTJ 138. The other source/drain terminal of the selection transistor 142 is connected to the bit line BL4 running over the semiconductor regions 600, 602. In some embodiments, this source/drain terminal of the selection transistor 142 is connected to the bit line BL4 through a top via 614 disposed between the bit line BL4 and the semiconductor region 602.

By disposing the non-volatile memory cell 130 over the SRAM cell 110, the non-volatile memory cell 130 can overlap the SRAM cell 110. Accordingly, the memory cell 100 can possess non-volatility provided by the non-volatile memory cell 130 without increasing total footprint area.

Figure 7:
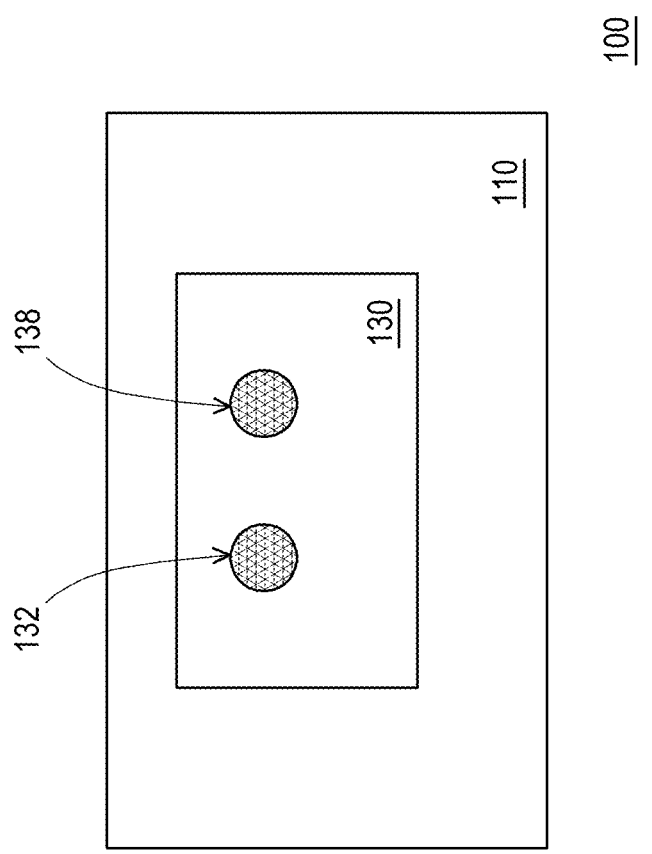
FIG. 7 is a schematic plan view illustrating an arrangement of the SRAM cell and the non-volatile memory cell in the same memory cell, according to some embodiments of the present disclosure.

FIG. 7 is a schematic plan view illustrating an arrangement of the SRAM cell 110 and the non-volatile memory cell 130 in the same memory cell 100, according to some embodiments of the present disclosure.

Referring to FIG. 7, the non-volatile memory cell 130 lying over the SRAM cell 110 overlaps the SRAM cell 110. In some embodiments, the non-volatile memory cell 130 entirely overlaps the SRAM cell 110. In these embodiments, a footprint area of the non-volatile memory cell 130 may be smaller than a footprint area of the SRAM cell 110. In addition, a total footprint area of the memory cell 100 may be substantially equal to the footprint area of the SRAM cell 110. In alternative embodiments, the non-volatile memory cell 130 partially overlaps the SRAM cell 100, and a total footprint area of the memory cell 100 may be slightly greater than the footprint area of the SRAM cell 110.

As above, a memory device including memory cells each having a SRAM cell and a non-volatile memory cell is provided. Data stored in the SRAM cell can be copied to the non-volatile memory cell before the SRAM cell is switched to a shut down mode where power supply is removed, and retained by the non-volatile memory cell during the shut down mode. When the SRAM cell is switched back to an active mode where the power supply is restored, the data retained in the non-volatile memory cell can be rewritten to the SRAM cell for further operation, and then the non-volatile memory cell is decoupled from the SRAM cell. In other words, it is the SRAM cell normally being operated. The non-volatile memory cell is involved during transition between the active mode and the shut down mode of the SRAM cell. As a result, the memory cell can have high operation speed, while possessing non-volatility provided by the non-volatile memory cell. Furthermore, the non-volatile memory cell is disposed over the SRAM cell, and may overlap the SRAM cell. Therefore, a footprint area of the memory cell can be identical or slightly greater than a footprint area of the SRAM cell.

It should be noted that, the SRAM cell described above is implemented as a six-transistors (6T) architecture. In other embodiments, more or fewer than six transistors may be used to implement the SRAM cell 110, and layout design of the SRAM cell 110 should be modified accordingly. For example, the SRAM cell 110 in some embodiments may use a 4T architecture, an 8T architecture or a 10T architecture.

In an aspect of the present disclosure, a memory device is provided. The memory cell includes memory cells. Each of the memory cells comprises: a static random access memory (SRAM) cell, configured to store complementary data at first and second storage nodes; and a non-volatile memory cell, configured to replicate and retain the complementary data stored in the SRAM cell, and comprising a first ferroelectric tunneling junction (FTJ) and a second FTJ, wherein the first and second FTJs respectively have a first terminal connected to a first bit line, a second terminal of the first FTJ is selectively connected to the first storage node of the SRAM cell and selectively connected to a second bit line, and a second terminal of the FTJ is selectively connected to the second storage node of the SRAM cell and selectively connected to the second bit line.

In another aspect of the present disclosure, a method for operating a memory device is provided. The memory device comprises a static random access memory (SRAM) cell configured to store complementary data at first and second storage nodes and a non-volatile memory cell comprising a first ferroelectric tunneling junction (FTJ) and a second FTJ selectively connected to the first and second storage nodes. The method comprises: pre-programming the first and second FTJs with a first polarization direction, wherein the first and second FTJs are disconnected from the SRAM cell during the pre-programming; connecting the first and second FTJs to the first and second storages of the SRAM cell before the SRAM cell is switched to a shut down mode, such that one of the first and second FTJs is overwritten with a second polarization direction by one of the first and second storage nodes, and the complementary data is replicated to the non-volatile memory cell; and charging one of the first and second storage nodes by one of the first and second FTJs after the SRAM cell is switched to an active mode from the shut down mode, so as to rewrite the complementary data to the SRAM cell.

In yet another aspect of the present disclosure, a memory device is provided. The memory device comprises a SRAM cell and a non-volatile memory cell. The SRAM cell is formed on a semiconductor substrate, and has a first storage node and a second storage node. The non-volatile memory cell is disposed over the SRAM cell, and comprises: a first semiconductor region and a second semiconductor region laterally spaced apart from the first semiconductor region, wherein the first semiconductor region is connected to the first storage node through a bottom via, and the second semiconductor region is connected to the second storage node through a second bottom via; a first ferroelectric tunneling junction (FTJ) and a second FTJ, electrically connected to the first and second semiconductor regions, respectively; a first word line, capacitively coupled to the first and second semiconductor regions in between the first FTJ and the first bottom via, and in between the second FTJ and the second bottom via; and a first bit line, electrically connected to the first and second FTJs, wherein the first FTJ is located between the first semiconductor region and the first bit line, and the second FTJ is located between the second semiconductor region and the first bit line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   memory cells, each comprising:
   a static random access memory (SRAM) cell, configured to store complementary data at first and second storage nodes; and
   a non-volatile memory cell, configured to replicate and retain the complementary data stored in the SRAM cell, and comprising a first ferroelectric tunneling junction (FTJ) and a second FTJ, wherein the first and second FTJs respectively have a first terminal connected to a first bit line, a second terminal of the first FTJ is selectively connected to the first storage node of the SRAM cell and selectively connected to a second bit line, and a second terminal of the second FTJ is selectively connected to the second storage node of the SRAM cell and selectively connected to the second bit line.

2. The memory device according to claim 1, wherein the non-volatile memory cell is further configured to be pre-programmed before replicating and retaining the complementary data stored in the SRAM cell.

3. The memory device according to claim 1, wherein the non-volatile memory cell is configured to replicate and retain the complementary data before the SRAM cell loses a power supply.

4. The memory device according to claim 3, wherein the non-volatile memory cell is further configured to rewrite the complementary back data to the SRAM cell when the power supply is restored.

5. The memory device according to claim 1,
wherein the second terminal of the first FTJ is connected to the first storage node of the SRAM cell via a first selection transistor, and is connected to the second bit line via a second selection transistor,
and wherein the second terminal of the second FTJ is connected to the second storage node of the SRAM cell via a third selection transistor, and is connected to the second bit line via a fourth selection transistor.

6. The memory device according to claim 5, wherein the first selection transistor and the third selection transistor are switched by a first word line, and the second selection transistor and the fourth selection transistor are switched by a second word line.

7. The memory device according to claim 1, wherein the first storage node of the SRAM cell is selectively connected to a third bit line, and the second storage node of the SRAM cell is selectively connected to a fourth bit line.

8. The memory device according to claim 7, wherein the first storage node of the SRAM cell is connected to the third bit line via a first access transistor, the second storage node of the SRAM cell is connected to the fourth bit line via a second access transistor, and the first and second access transistors are switched by a third word line.

9. A method for operating a memory device, wherein the memory device comprises a static random access memory (SRAM) cell configured to store complementary data at first and second storage nodes and a non-volatile memory cell comprising a first ferroelectric tunneling junction (FTJ) and a second FTJ selectively connected to the first and second storage nodes, and the method comprises:
pre-programming the first and second FTJs with a first polarization direction, wherein the first and second FTJs are disconnected from the SRAM cell during the pre-programming;
connecting the first and second FTJs to the first and second storages of the SRAM cell before the SRAM cell is switched to a shut down mode, such that one of the first and second FTJs is overwritten with a second polarization direction by one of the first and second storage nodes, and the complementary data is replicated to the non-volatile memory cell; and
charging one of the first and second storage nodes by one of the first and second FTJs after the SRAM cell is switched to an active mode from the shut down mode, so as to rewrite the complementary data to the SRAM cell.

10. The method for operating the memory device according to claim 9, wherein the first and second FTJs respectively have a first terminal connected to a first bit line, a second terminal of the first FTJ is selectively connected to the first storage node of the SRAM cell and selectively connected to a second bit line, and a second terminal of the FTJ is selectively connected to the second storage node of the SRAM cell and selectively connected to the second bit line.

11. The method for operating the memory device according to claim 10, wherein pre-programming the first and second FTJs comprises:
connecting the second bit line to the first and second FTJs while the first and second FTJs are disconnected from the first and second storage nodes of the SRAM cell; and
setting a voltage difference on the first and second bit lines, to program the first and second FTJs with the first polarization direction.

12. The method for operating the memory device according to claim 10, wherein the first and second FTJs are disconnected from the second bit line while being connected to the first and second storage nodes of the SRAM cell.

13. The method for operating the memory device according to claim 10, wherein connection between the first FTJ and the first storage node is controlled by a first selection transistor, connection between the first FTJ and the second bit line is controlled by a second selection transistor, connection between the second FTJ and the second storage node is controlled by a third selection transistor, and connection between the second FTJ and the second bit line is controlled by a fourth selection transistor.

14. The method for operating the memory device according to claim 13, wherein the first and third selection transistors are switched by a first word line, and the second and fourth selection transistors are switched by a second word line.

15. The method for operating the memory device according to claim 9, wherein the non-volatile memory cell is decoupled from the SRAM cell after rewriting the complementary data to the SRAM cell and before the SRAM cell is switched to the shut down mode once again.

16. A memory device, comprising:
a static random access memory (SRAM) cell, formed on a semiconductor substrate, and having a first storage node and a second storage node; and
a non-volatile memory cell, disposed over the SRAM cell, and comprising:
a first semiconductor region and a second semiconductor region laterally spaced apart from the first semiconductor region, wherein the first semiconductor region is connected to the first storage node through a bottom via, and the second semiconductor region is connected to the second storage node through a second bottom via;
a first ferroelectric tunneling junction (FTJ) and a second FTJ, electrically connected to the first and second semiconductor regions, respectively;
a first word line, capacitively coupled to the first and second semiconductor regions in between the first FTJ and the first bottom via, and in between the second FTJ and the second bottom via; and
a first bit line, electrically connected to the first and second FTJs, wherein the first FTJ is located between the first semiconductor region and the first bit line, and the second FTJ is located between the second semiconductor region and the first bit line.

17. The memory device according to claim 16, wherein the non-volatile memory cell further comprises:
a second bit line, electrically connected to the first and second semiconductor regions; and
a second word line, capacitively coupled to the first and second semiconductor regions, wherein the second word line is located between the second bit line and the first FTJ, and between the second bit line and the second FTJ.

18. The memory device according to claim 17, wherein the first and second word lines are disposed below the first and second semiconductor regions, and the first and second FTJs as well as the first and second bit lines are disposed above the first and second semiconductor regions.

19. The memory device according to claim 16, wherein the SRAM cell is overlapped with the non-volatile memory.

20. The memory device according to claim 16, wherein the non-volatile memory cell is smaller in size as compared to the SRAM cell, and entirely overlaps the SRAM cell.

* * * * *